(12) United States Patent
Guo et al.

(10) Patent No.: US 7,374,864 B2
(45) Date of Patent: May 20, 2008

(54) COMBINED NANOIMPRINTING AND PHOTOLITHOGRAPHY FOR MICRO AND NANO DEVICES FABRICATION

(75) Inventors: Lingjie J. Guo, Ann Arbor, MI (US); Xing Cheng, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 106 days.

(21) Appl. No.: 10/545,456

(22) PCT Filed: Feb. 13, 2004

(86) PCT No.: PCT/US2004/004319

§ 371 (c)(1),
(2), (4) Date: Mar. 3, 2006

(87) PCT Pub. No.: WO2005/029179

PCT Pub. Date: Mar. 31, 2005

(65) Prior Publication Data

US 2006/0237881 A1    Oct. 26, 2006

Related U.S. Application Data

(60) Provisional application No. 60/447,116, filed on Feb. 13, 2003.

(51) Int. Cl.
*G03C 5/00* (2006.01)
(52) U.S. Cl. ............... 430/302; 430/325; 430/327; 430/330; 264/494; 264/496
(58) Field of Classification Search ............... 430/302, 430/325, 326, 327, 330; 264/494, 496
See application file for complete search history.

(56) References Cited

OTHER PUBLICATIONS

Step and Flash Impring Lithography: A New Approach to High-Resolution Patterning, M. Colburn, S. Johnson, M. Stewart, S. Damle, T. Bailey, B. Choi, M. Wedlake, T. Michaelson, S.V. Sreenivasan, J. Ekerdt, and C.G. Willson, Texas Materials Institute, The University of Texas at Austin, TX 78712, 11 pages, 2005.
Pattern formation in hot embossing of thin polymer films, H. Schift, L.J. Heyderman, M. Auf der Maur and J. Gobrecht, Institute of Physics Publishing, Nanotechnology 12 (2001), pp. 173-177.
One-step lithography for various size patterns with a hybrid mask-mold, Xing Cheng, L. Jay Guo, Microelectronic Engineering 71 (2004), pp. 288-293.
A combined-nanoimprint-and-photolithography patterning techniguq, Xing Cheng, L. Jay Guo, Microelectronic Engineering 71 (2004), pp. 277-282.
Flow behaviour of thin polymer films used for hot embossing lithography, L.J. Heydermann, H. Schift, C. David, J. Gobrecht, T. Schweizer, Microelectronic Engineering 54 (2000), pp. 229-245.
Deep-Ultraviolet Contact Photolithography, James G. Goodberlet, Bryan L. Dunn, Microelectronic Engineering 53 (2000), pp. 95-99.

Multistep profiles by mix and match of nanoimprint and UV lithography, K. Pfeiffer, M. Fink, G. Gruetzner, G. Bleidiessel, H. Schulz, H. Scheer, Microelectronic Engineering 57-58 (2001), pp. 381-387.
Mix and match of nanoimpring and UV lithography, Freimut Reuther, Karl Pfeiffer, Marion Fink, Gabi Gruetzner, Hubert Schulz, Hella-Christin Scheer, Freddy Gaboriau, Christophe Cardinaud, micro resist technology GmbH, Koepenicker Str. 325, 12555 Berlin, Germany, University of Wuppertal, Dept. of Electrical and Information Engineering, Fuhlrottstr. 10, 42097 Wuppertal, Germany, Institute for Materials Science, University of Nantes, Laboratory of Plasmas and Thin Layers, 2, Rue de la Houssiniere, BP 32229, 44322 Nantes, Cedex 03, France, 8 pages, 2005.
Characterization and application of a UV-based imprint technique, M. Otto, M. Bender, B. Hadam, B. Spangenberg, H. Kurz, Microelectronic Engineering 57-58 (2001), pp. 361-366.
A contribution to the flow behaviour of thin polymer films during hot embossing lithography, H.-C. Scheer, H. Schultz, Microelectronic Engineering 56 (2001), pp. 311-332.
Nanoimprint- and UV-lithography: Mix&Match process for fabrication of interdigitated nanobiosensors, L. Montelius, B. Heidari, M. Graczyk, I. Maximov, E-L. Sarwe and T.G.I. Ling, Microelectronic Engineering 53 (2000), pp. 521-524.
Imprint of sub-25 nm vias and trenches in poymers, Stephen Y. Chou, Peter R. Krauss, and Preston J. Renstrom, 1995 American Institute of Physics, Appl. Phys. Lett. 67 (21), Nov. 20, 1995, pp. 3114-3116.
Light-coupling masks: An alternative, lensless approach to high-resolution optical contact lithography, Heinz Schmid, Hans Biebuyck, Bruno Michel, Olivier J. F. Martin and Nicolas B. Piller, 1998 American Vacuum Society, J. Vac. Sci. Technol. B 16(6), Nov./Dec. 1998—Microelectronics and Nanometer Structures, pp. 3422-3425.
Problems of the nanoimprinting technique for nanometer scale pettern definition, H.-C. Scheer, H. Schulz, T. Hoffmann and C.M. Sotomayor Torres, 1998 American Vacuum Society, J. Vac. Sci. Technol. B 16(6), Nov./Dec. 1998—Microelectronics and Nanometer Structures, pp. 3917-3921.
Sub-10 nm imprint lithography and applications, Stephen Y. Chou, Peter R. Krauss, Wei Zhang, Lingjie Guo and Lei Zhuang, 1997 American Vacuum Society, J. Vac. Sci. Technol. B 15(6), Nov./Dec. 1997—Microelectronics and Nanometer Structures, pp. 2897-2904.

*Primary Examiner*—Christopher G. Young
(74) *Attorney, Agent, or Firm*—Harness, Dickey & Pierce, P.L.C.

(57) ABSTRACT

A method of fabricating a device including imprinting a mold having a protrusion against a substrate having a resist layer such that the protrusion engages the resist layer. The mold further has a mask member positioned generally adjacent the resist layer. Radiation energy is then transmitted through the mold and into the resist layer; however, the mask member substantially prevents transmission of the radiation energy therethrough, thereby defining an unexposed area in the resist layer. Once the mold is removed from the substrate, which consequently forms a first feature from nanoimprinting, the unexposed area of resist layer is removed through dissolving in a developer solution.

13 Claims, 7 Drawing Sheets

PRIOR ART

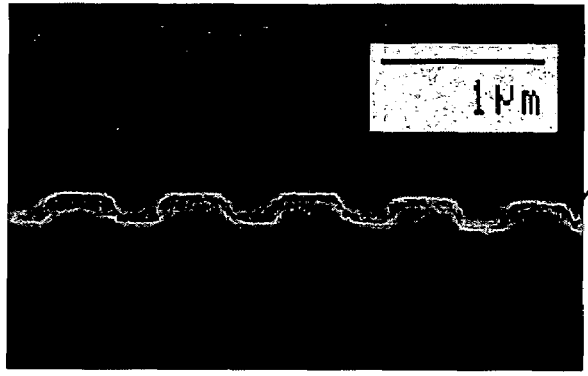
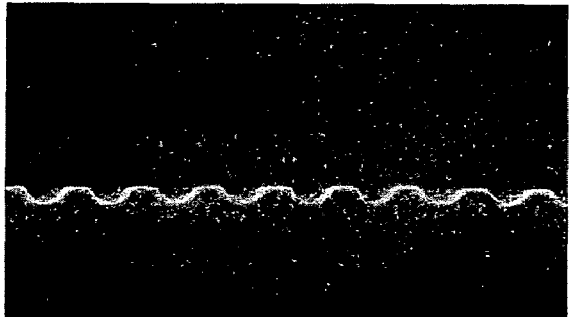
*Fig-8*
PRIOR ART
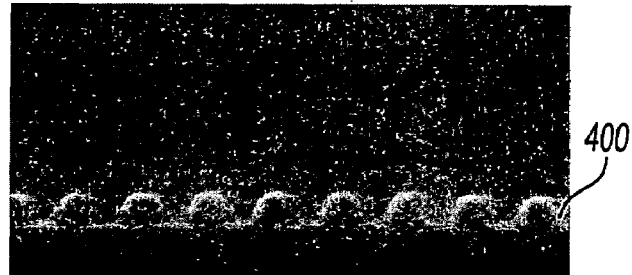

COMBINED NANOIMPRINTING AND PHOTOLITHOGRAPHY FOR MICRO AND NANO DEVICES FABRICATION

CROSS-REFERENCE TO RELATED APPLICATIONS

This application claims the benefit of U.S. Provisional Application No. 60/447,116, filed on Feb. 13, 2003. The disclosure of the above application is incorporated herein by reference.

STATEMENT OF GOVERNMENTAL SUPPORT

This invention was made with Government support under Grant No. N00014-02-1-0899 awarded by the Office of Naval Research and Grant No. N66001-02-C-8039 awarded by Defense Advanced Research Projects Agency (DARPA). The government has certain rights in this invention.

FIELD OF THE INVENTION

The present invention generally relates to the fabrication of nano and microstructures and, more particularly, relates to nano-scale patterning for nano and microstructures as well as potential applications.

BACKGROUND AND SUMMARY OF THE INVENTION

Nano-patterning is an essential part of nanotechnology research and is used to fabricate nanostructures to harness their unique properties. However, in order for nano-device and nanostructure fabrication to have significant practical value, a low-cost and high-throughput nano-patterning technique is needed. Among many new emerging lithography techniques that are aimed at addressing this issue, nanoimprinting techniques are regarded as one of the most promising.

Nanoimprint lithography (NIL) is a nano-scale lithography technique where a surface relief pattern on a hard mold is physically imprinted into a thermal plastic polymer film at elevated temperature and pressure. Nanoimprint lithography has attracted more and more attention in both research and commercial applications due to its potential application in nano-scale patterning. It is often desirable because of its sub-10 nm resolution and simple equipment setup requirements. Nanoimprint lithography is further a relatively simple process that has high throughput, thus enabling low-cost, large-scale patterning of nano-structures.

Although nanoimprint lithography has proved to be very successful in nano-patterning, especially in replicating nano-scale features with uniform sizes, it still suffers from several limitations as a flexible lithographic technique. A preferred lithographic technique should be capable of producing both large and small features in various combinations and distributions, which is a typical requirement in micro- and nano-fabrication processes. For example, in the case of imprint lithography (such as nanoimprint lithography), mold features on the mold are physically pressed into a polymer. Larger features on the mold must displace more polymer material over larger distances. Thus, patterns with large features are much more difficult to imprint than smaller features (also known as nano-patterns). Furthermore, defects or pattern failures in the form of incomplete pattern transfer can occur due to the high viscosity of the polymer melt and the mold pattern complexity.

On the other hand and separate from nanoimprint lithography, photolithography is a well-developed process and has been pushed towards its limit to maintain its role in future microelectronic fabrication. In most cases, the cost of these next generation photolithography systems is prohibitive, except for large-scale production runs.

The present invention combines the processing steps of nanoimprint lithography and photolithography to provide a new technique that provides many new advantages. That is, the present invention enables patterning of both large-scale and sub-micron size structures in a single step. With many advantages, the present invention may be used in the fabrication of a wide range of nano-scale electronic, photonic, and biological devices where patterns of various sizes and densities are needed.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 8(a) is an SEM micrograph of a portion of the hybrid mold used according to the present embodiment;

FIG. 8(b) is an SEM micrograph of a resultant pattern formed according to the prior art;

FIG. 8(c) is an SEM micrograph of a resultant pattern formed according to the present embodiment;

DETAILED DESCRIPTION OF THE PREFERRED EMBODIMENTS

The following description of the preferred embodiments is merely exemplary in nature and is in no way intended to limit the invention, its application, or uses.

Figure 1:
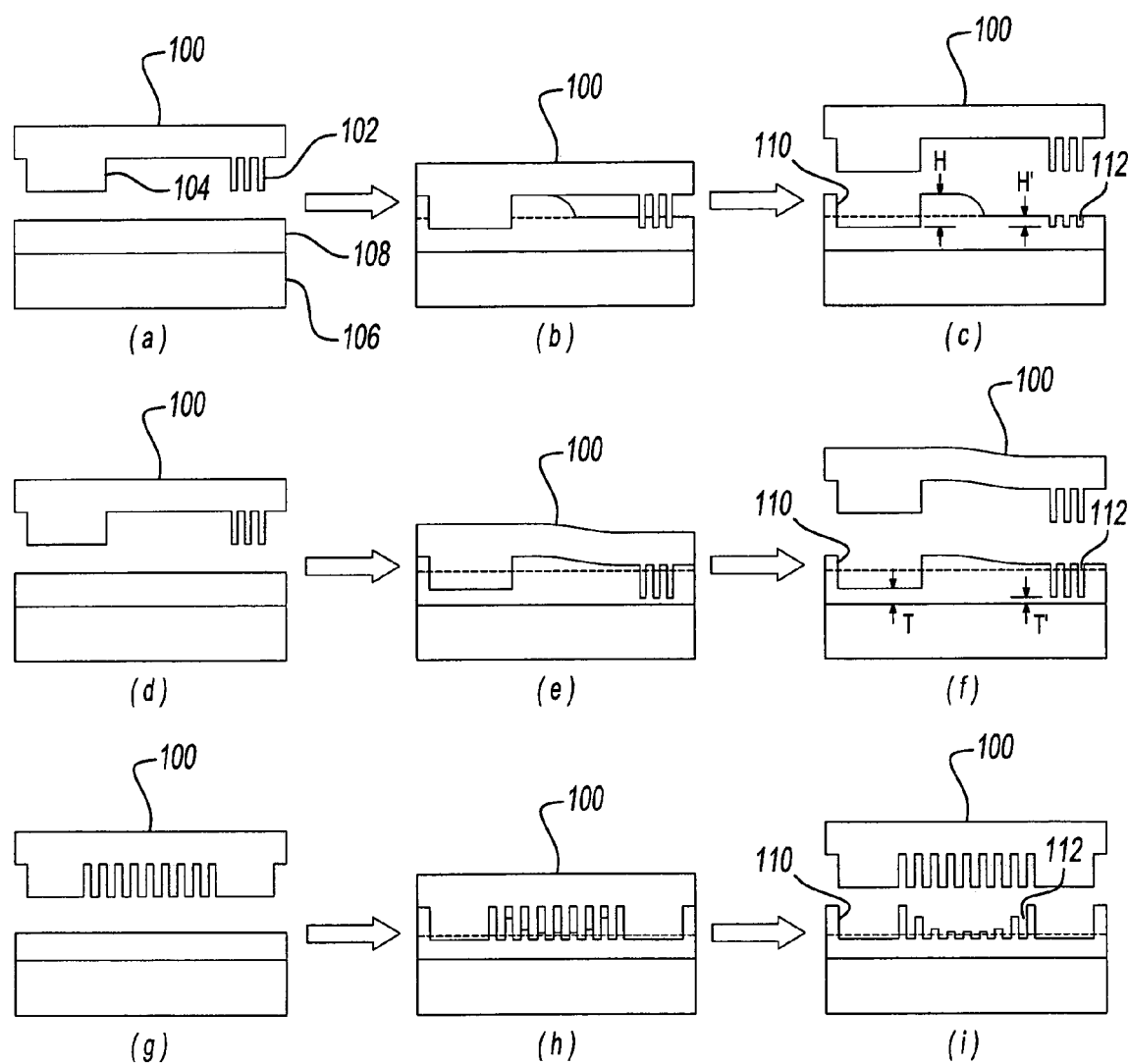
FIGS. 1(a)-(c) is a series of cross sectional schematic views illustrating non-uniform pattern height according to the prior art.
FIGS. 1(d)-(f) is a series of cross sectional schematic views illustrating non-uniform residual layer thickness according to the prior art.
FIGS. 1(g)-(i) is a series of cross sectional schematic views illustrating incomplete nano-pattern replication according to the prior art.

In order to appreciate the advantages and concepts of the present invention, it is believed that a brief explanation of nanoimprinting is beneficial. Therefore, with reference to FIG. 1, several disadvantages of a conventional nanoimprinting method are discussed. A primary disadvantage of convention nanoimprinting is its inability to pattern a wide variety of feature sizes simultaneously.

Briefly, conventional nanoimprinting employs a mold 100 having of a combination of nano-scale mold features 102 adjacent to large-scale mold features 104. If a low pressure is used for imprinting (see FIGS. 1(a)-(c)), there will be no bending in either mold 100 or a substrate 106. Mold features 102, 104 penetrate into a resist layer or polymer film 108 on substrate 106 in a parallel fashion as shown. However, because of viscous polymer flow, large-scale mold feature 104 cannot fully penetrate the polymer film 108 in a period that is practical for nanoimprint lithography. In other words, large-scale mold feature 104 can not displace sufficient portions of polymer film 108 to achieve the desired penetration within a reasonable time period. Not only does this lead to incomplete polymer molding of large-scale patterns 110, but nano-scale mold features 102 next to large-scale mold features 104 are also strongly affected, thereby yielding a shallower nano-scale pattern 112 than desired. This creates a reduced aspect ratio for the nano-patterns 112, which significantly increases the difficulty in the subsequent fabrication processing steps—such as metal lift-off or pattern transfer into substrates.

However, if a high pressure is used in nanoimprinting, either mold 100 or substrate 106 may bend such that they have conformal contact at polymer resist layer 108, as shown in FIGS. 1(d)-(f). In this case, the same feature height can be achieved for both large-scale and nano-scale patterns. However, due to mold bending, the nano-scale relief patterns 112 penetrate deeper into resist layer 108 than large-scale patterns 110. This leads to a thinner residue layer, T', in the nano-scale pattern region than that in the large-scale pattern region, T. This non-uniform thickness T, T' across the sample makes it difficult to determine how much etching is necessary to remove the residual layer. Some patterns might be lost if not enough of the residual layer is removed, while over removal can reduce the aspect ratio of the nano-scale resist feature.

Due to the mechanical molding nature of nanoimprint lithography, the displaced polymer melt must be accommodated by recessed regions on the mold. Therefore, the location and size of recessed areas on the mold can affect nanoimprint lithography results. Complex mask patterns will give rise to a random distribution of the recessed areas on the mold and some patterns cannot be fully replicated in the imprinting process. FIGS. 1(g)-(i) illustrate an example where nano-patterns are next to the large structures on the mold. The displaced polymer (i.e. resist layer) cannot reach the center of the nano-pattern region, leaving the center of the nano-patterns incompletely formed.

The aforementioned pattern failures are related to the mold pattern itself and are inherent in nanoimprint lithography process. In real applications, micro- and nano-fabricated devices usually require a mixture of arbitrary patterns of various sizes. Therefore, the pattern-related defects and failure can limit the versatility of nanoimprint lithography technique in general microfabrication.

The previous approach to address the issue of replicating patterns of various sizes was to use a mix-and-match method that is carried out in two separate steps. In a typical mix-and-match approach, the nano-scale pattern is defined by nanoimprint lithography first, and the large-scale pattern is added afterwards by conventional photolithography. In this approach, not only is alignment needed between the two steps, but also the accuracy is limited in the photolithography step. This extra photolithography step adds complexity and cost to the overall process.

Therefore, according to a first embodiment of the present invention, a novel method of combined nanoimprint and photolithography is provided that integrates the benefits of nanoimprinting with the benefits of photolithography to achieve new micro and nano fabrication capability not otherwise possible using the techniques individually.

Figure 2:
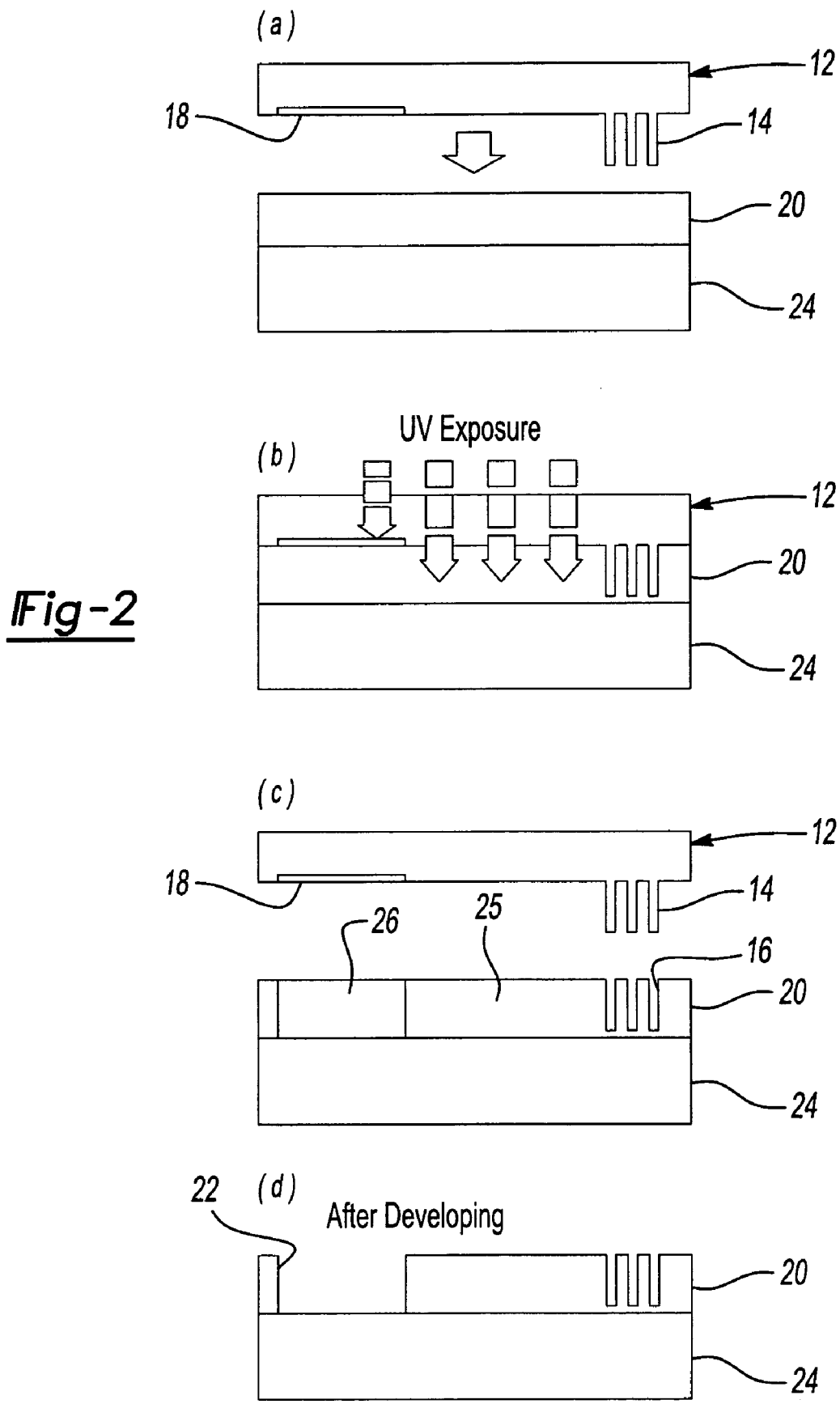
FIGS. 2(a)-(d) is a series of cross sectional schematic views illustrating the method steps of a first embodiment of the present invention.

As best seen in FIGS. 2(a)-(d), the method according to the present invention is illustrated. The present invention employs a hybrid mold configuration, generally indicated at 12, which acts as both a nanoimprint lithography mold and a photolithography mask—an example of hybrid mold 12 is illustrated at FIG. 2(a). Hybrid mold 12 is preferably made of an ultraviolet (UV) transparent material, such as fused silica. Protrusions 14 are formed on hybrid mold 12 for physically imprinting nano-scale features 16 within a resist layer 20 on a substrate 24. Hybrid mold 12 further includes mask members 18, in the form of metal pads, embedded therein to serve as ultraviolet radiation masks for photolithography of large patterns 22 in resist layer 20. In other words, metal pads 18 prevent the free transmission of ultraviolet radiation through hybrid mold 12 and into resist layer 20. It should be understood that mask members 18 are not limited to metal members, but can be any material that will inhibit the free transmission of radiation energy therethrough. Resist layer 20 may be either a negative tone photoresist or a UV-curable monomer.

The processing steps of the present invention are very simple, convenient, and inexpensive. Specifically, and with continued reference to FIGS. 2(a)-(d), hybrid mold 12 first imprints protrusions 14 into resist layer 20 via applied pressure to form nano-scale features 16. This is often done when resist layer 20 is at about its glass transition temperature. However, depending on the resist layer material chosen, the imprinting could be done at any temperature, such as room temperature. While hybrid mold 12 remains within or engaged with resist layer 20, hybrid mold 12, resist layer 20, and a substrate 24 are exposed to ultraviolet (UV) radiation (see FIG. 2(b)). As described above, hybrid mold 12 is generally transmissive to ultraviolet (UV) radiation except through those portions that are obstructed by metal pads 18. Therefore, ultraviolet radiation passes through those transmissive portions not obstructed by metal pads 18 and into resist layer 20 thereby exposing portions 25 of resist layer 20. Hybrid mold 12 is then removed from resist layer 20 (see FIG. 2(c)) and resist layer 20 is developed within a developing solution. According to the present embodiment, the developing of resist layer 20 causes those portions 26, which are unexposed to the ultraviolet radiation, to be removed through photolithography while those portions 25, which were exposed to the ultraviolet radiation, to remain intact (see FIG. 2(d)). Therefore, according to the present invention, both large-scale patterns 22 and nano-scale patterns 16 are created simultaneously without suffering from the disadvantages of the prior art.

The effectiveness of the present invention is illustrated through a comparison of a resultant product formed according to the present invention and a resultant product formed according to conventional nanoimprint lithography, as illustrated in FIGS. 3(a)-(c) and 4(a)-(c). According to the present comparison, a test pattern consisting of two major components—200 μm squares and closely spaced 350 nm wide relief beams—was used.

In fabricating hybrid mold 12, a thin layer of polymethyl methacrylate (PMMA) with an average molecular weight of 15,000 was spun on a fused silica substrate. A grating mold with 700 nm pitch and 50% duty cycle was then used to pattern the PMMA resist on the substrate by conventional nanoimprint lithography at 175° C. and 50 kg/cm². After a Ni evaporation and lift-off, the fused silica is etched by reactive ion etching (RIE) to form nano-scale protrusions 14 on hybrid mold 12. Next, 200-μm size pixel patterns are added to hybrid mold 12 by photolithography. After photolithography, the exposed fused silica region is etched by RIE using the patterned photoresist as a mask, which creates 200 μm size shallow cavities. These shallow cavity patterns are back-filled with metals such as Cr or Ni that have high absorption coefficient for UV light by e-beam evaporation and lift-off. SU-8, a common negative tone photoresist, was used in this example. In this case, hybrid mold 12 is thus formed and may be used to form a plurality of resultant products. It should be appreciated that the above description only illustrates one of many ways to fabricate hybrid mold 12.

In both cases, the imprinting of the mold in the resist layer is done at 80° C. under a pressure of 50 kg/cm2. In the method according to the present invention, hybrid mold 12 is exposed to a 365 nm UV light while disposed within resist layer 20. Hybrid mold 12 and resist layer 20 are then separated after baking at 80° C. on a hotplate for 1 minute. Substrate 24 and resist layer 20 are developed in SU-8 developer solvent for 1 minute to remove unexposed resist portions 26.

Figure 3:
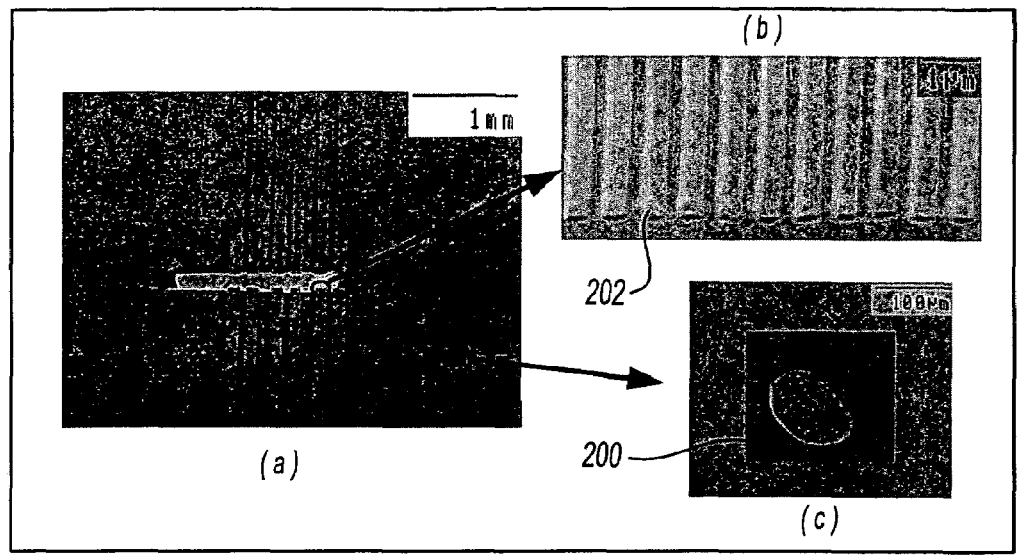
FIG. 3(a) is a perspective view illustrating an SEM micrograph of a resist pattern formed according to the prior art.
FIG. 3(b) is an enlarged perspective view illustrating an SEM micrograph of relief beams in the resist pattern formed according to the prior art.
FIG. 3(c) is an enlarged perspective view illustrating an SEM micrograph of 200 μm squares in the resist pattern formed according to the prior art.

Referring now to FIGS. 3(a)-(c), SEM images are provided that illustrate the SU-8 patterns obtained by conventional nanoimprint lithography. It can be clearly seen that each 200 μm square (FIGS. 3(a) and 3(c)) has a large void defect 200 in the middle of the resist pattern, which is due to insufficient SU-8 flow during nanoimprint lithography. Additionally, because the SU-8 melt is not easily displaced, the 350 nm beam protrusion features of the mold cannot completely penetrate into the SU-8 resist film. This leads to a grating pattern 202 that is much shallower than that on the mold.

Figure 4:
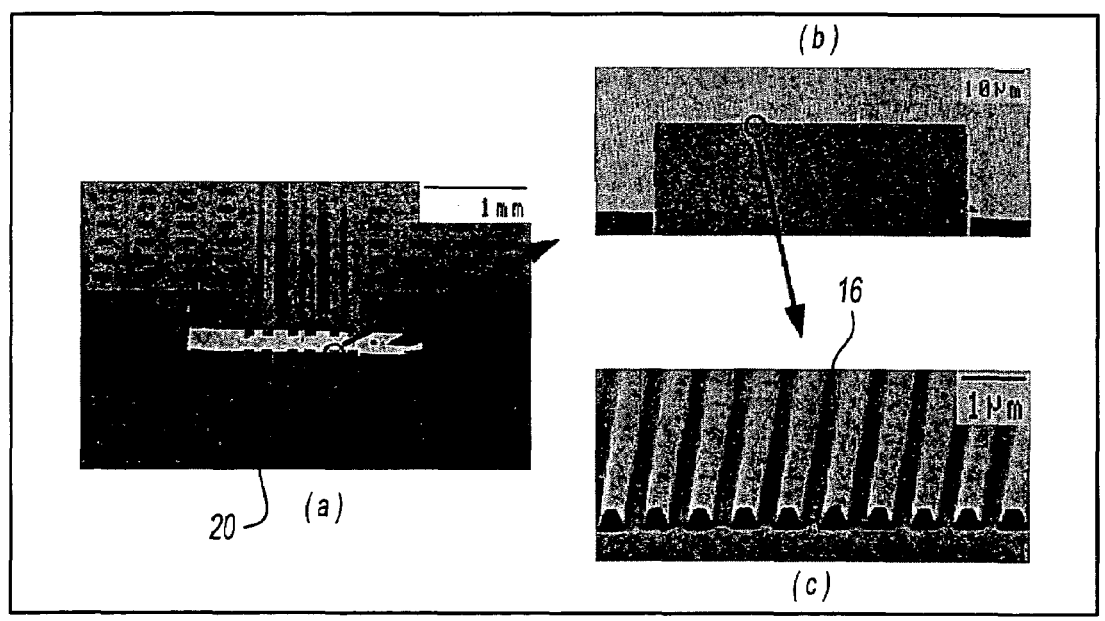
FIG. 4(a) is a perspective view illustrating an SEM micrograph of a resist pattern formed according to the present invention.
FIG. 4(b) is an enlarged perspective view illustrating an SEM micrograph of relief beams in the resist pattern formed according to the present invention.
FIG. 4(c) is a further enlarged perspective view illustrating an SEM micrograph of the relief beams in the resist pattern formed according to the present invention.

In contrast, the problems of conventional nanoimprint lithography illustrated in FIGS. 3(a)-(c) are solved by the present invention, which is illustrated in FIGS. 4(a)-(c). FIG. 4(a) specifically illustrates the results obtained by the present invention under the same imprinting conditions, followed by UV exposure and resist developing. As can be seen, no defects are observed in any of the 200-μm square patterns. Similarly, the 350 nm beam pattern is well replicated and has the same height as protrusions 14 on hybrid mold 12.

According to a second embodiment of the present invention, yet another new method of combined nanoimprint and photolithography is provided wherein a metal layer is placed on an end of the mold protrusion feature, which eliminates the separate residual removal step in nanoimprint lithography.

According to the present embodiment as illustrated in FIGS. 5(a)-(d), hybrid mold 12 is modified, generally designated as hybrid mold 12', such that it includes a light-blocking metal layer 50, such as nickel, disposed at an end of nano-scale protrusions 14. Metal layer 50, similar to metal layer 18, acts as an embedded photomask and prevents ultraviolet radiation from penetrating into portions of resist layer 20 (specifically, a residual layer of resist disposed at a lowermost portion of the feature on top of substrate 24).

Figure 5:
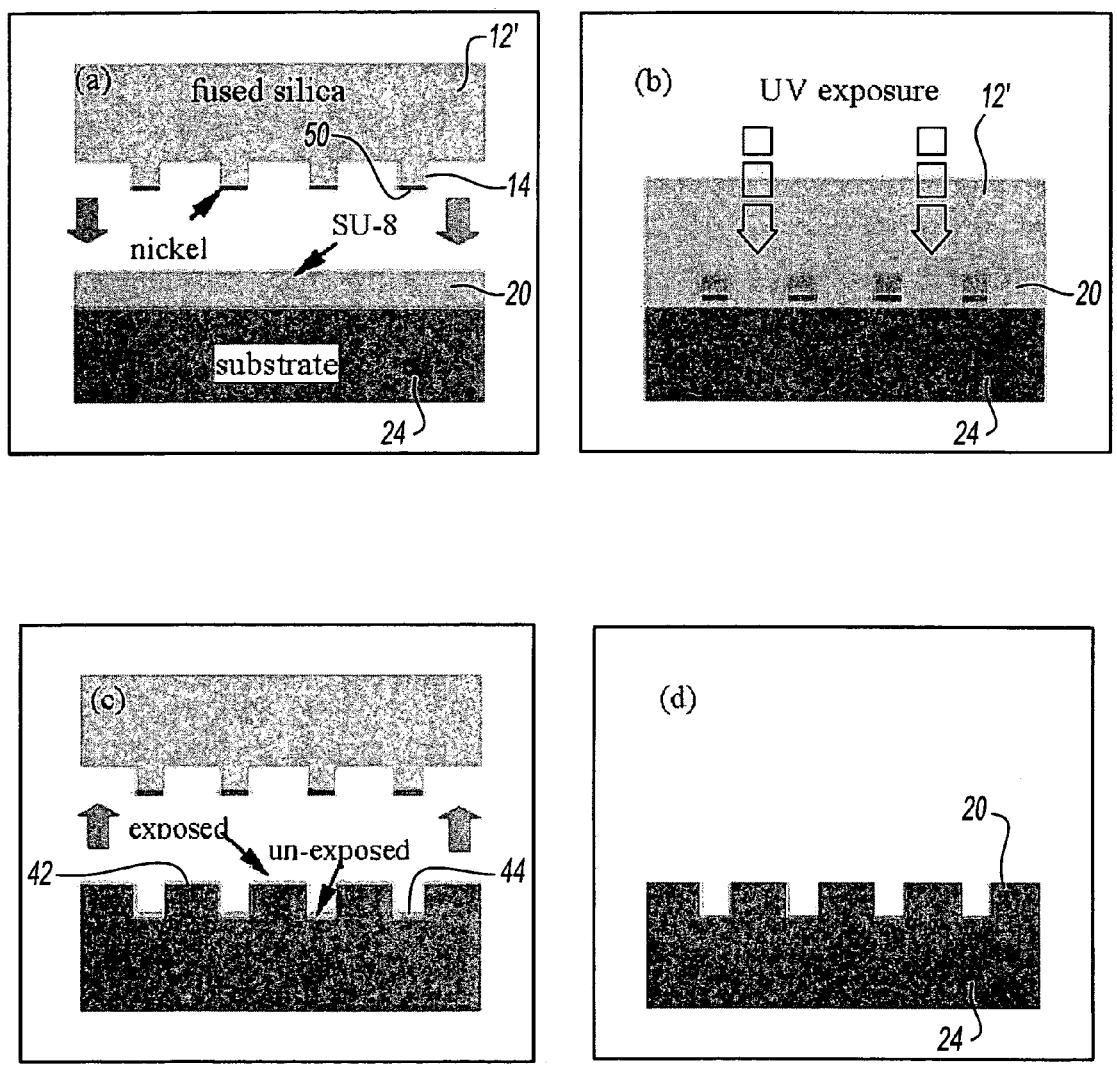
FIGS. 5(a)-(d) is a series of cross sectional schematic views illustrating the method steps of a second embodiment of the present invention.

More particularly, hybrid mold 12' is first imprinted into resist layer 20, such as a negative tone UV resist (see FIG. 5(a)). The entire assembly is then flood-exposed with ultraviolet (UV) radiation having a wavelength of 365 nm, preferably (see FIG. 5(b)). However, it should be appreciated that radiation energy have other wavelengths may be used. In fact, it has been found that shorter wavelengths provided enhanced resolution. During this exposure, metal layers 18, 50 block the ultraviolet (UV) radiation from entering portions of resist layer 20. After exposure, hybrid mold 12' is separated from resist layer 20 and substrate 24 (see FIG. 5(c)), thereby leaving exposed portions 42 and unexposed portions 44. Unexposed portions 44 of resist layer 20 are then easily removed using a developer solution. Hence, according to the present embodiment, resist patterns without residual layer can be obtained in a single step, which eliminates the separate $O_2$ RIE step that is necessary in both conventional nanoimprint lithography and conventional S-FIL.

The effectiveness of the present invention is illustrated through a comparison of a resultant product formed according to the present invention and a resultant product formed according to conventional nanoimprint lithography.

Figure 6:
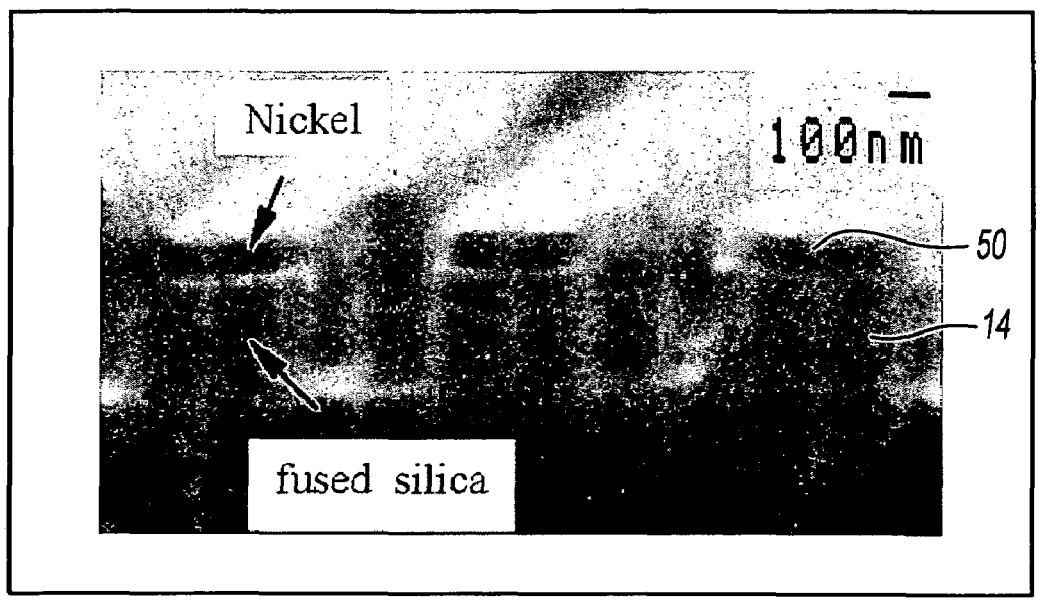
FIG. 6 is an SEM micrograph illustrating a portion of the hybrid mold formed according to the second embodiment.

To fabricate hybrid mold 12', patterns are first defined in resist layer on a fused silica substrate by using any appropriate lithography technique. Titanium/Nickel double layer is then deposited on top of the resist template, where the titanium enhances the adhesion of the nickel on silica substrate and increases the durability of metal layer for repeated imprinting cycles. After a lift-off process, the nickel pattern is used as etching mask for the RIE of the silica substrate. The nickel film remains on the etched oxide protrusion after the etching process. The fabricated silica mold substrate is then treated with a brief $O_2$ RIE to oxidize the metal surface, and a surfactant coating process similar to that used in nanoimprint lithography completes the fabrication of hybrid mold 12'. FIG. 6 is an SEM micrograph illustrating an example of hybrid mold 12' wherein metal layer 50 is disposed upon nano-scale protrusions 14.

Figure 7:
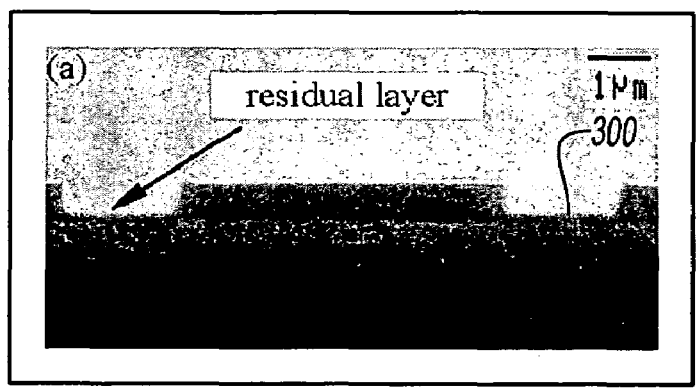
FIG. 7(a) is an SEM micrograph illustrating the residual layer of resist layer remaining following fabrication according to the prior art.
FIG. 7(b) is an SEM micrograph illustrating the lack of a residual layer of resist layer remaining following fabrication according to the present embodiment.
Figure 7:
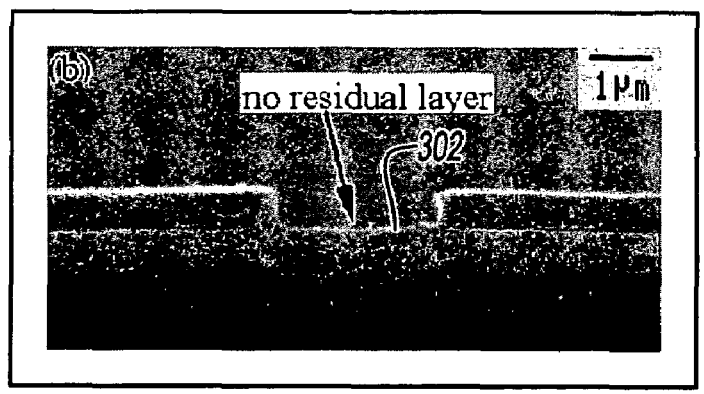

Hybrid mold 12' is then used as similarly described in connection with hybrid mold 12 to form a resultant product for comparison with a product formed through conventional nanoimprint lithography. This comparison can be seen in FIGS. 7(a) and (b). FIG. 7(a) illustrates the resultant product produced using conventional nanoimprint lithography, while FIG. 7(b) illustrates the resultant product produced according to the second embodiment of the present invention. In both cases, an imprinting pressure of 50 kg/cm$^2$ and a temperature of 80° C. were used. A residual layer 300 is clearly seen in the SU-8 pattern after conventional nanoimprint lithography imprinting, while no residual layer 302 is left following completion of the method of the present invention.

This complete residual layer removal of the present invention is further demonstrated in sub-micron structures as shown in FIGS. 8(a)-(c), while illustrate that according to the present invention it is possible to create resultant features that actually have higher aspect-ratios than those defined in hybrid mold 12, 12'. This is illustrated in the following figures: FIG. 8(a) illustrates the SEM micrograph of hybrid mold 12' having 700 nm period grating features; FIG. 8(b) illustrates the 700 nm pitch SU-8 grating obtained by conventional nanoimprint lithography imprinting; and FIG. 8(c) illustrates the grating obtained through the method of the present invention. As can be seen, the height of the grating 400 produced by the present invention (FIG. 8(c)) can actually be higher than that on hybrid mold 12, 12' (FIG. 8(a)). In other words, the present invention can create pattern features with higher aspect ratio than that on the mold. This is in strong contrast to conventional nanoimprint lithography where the required residual removal step by oxygen RIE usually reduces the aspect ratio of the imprinted structure. This feature is advantageous for nano-scale patterning where patterns with higher aspect ratios can greatly ease the subsequent processing steps. When compared with S-FIL, a variation of nanoimprint lithography technique that uses transparent mold and UV curable monomer as resist, the method of the present invention is able to achieve all of the benefits of S-FIL, while also providing additional advantages in residual removal and increased pattern aspect ratio. In addition, the metal layer on the hybrid mold used in this technique serves as improved registration marks as compared with the mere surface relief structures used in S-FIL or NIL. That is, the latter is unable to create much refractive index contrast upon intimate contact with a polymer layer that has a similar refractive index, and therefore makes the registration marks hardly visible.

From the above, it is clear that the method of the present invention effectively addresses the issues that conventional nanoimprint lithography fails to overcome. A further benefit of the present invention is that the resist layer, being perhaps photoresist or UV-curable material, can have improved chemical formulation to provide higher etching durability as compared with thermal plastic polymers that are commonly used in conventional nanoimprint lithography.

As should now be appreciated, there are many distinct advantages of the present invention relative to the prior art. First, the present invention enables one-step lithography of arbitrary patterns containing both large-scale and nano-scale structures. Second, because there are only nano-scale mold protrusion features on hybrid mold 12, the present invention allows low imprinting pressure to be used since only a very small amount of polymer needs to be displaced. Third, by forming the large patterns as a photomask (i.e. making them as metal pads), it reduces the complexity of the relief pattern on the hybrid mold. This simplifies residue layer thickness distribution, which can ease the step for residue removal significantly. Finally, this hybrid mask-mold scheme retains all the advantages of conventional nanoimprint lithography and step-and-flash imprint lithography (S-FIL), such as low-cost, high-throughput, simple process, and capable of alignment.

Figure 9:
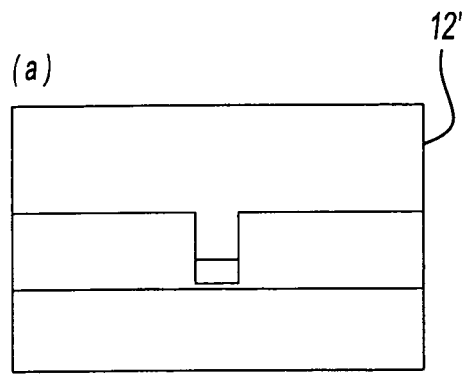
FIG. 9(a) is a cross sectional schematic view illustrating the hybrid mold according to the second embodiment.
FIG. 9(b) is a cross sectional schematic view illustrating a mold according to a prior art method.
FIG. 9(c) is a cross sectional schematic view illustrating a mold according to a prior art method.
FIG. 9(d) is a cross sectional schematic view illustrating a mold according to a prior art method.
FIG. 9(e) is a cross sectional schematic view illustrating a mold according to a prior art method.
Figure 9:
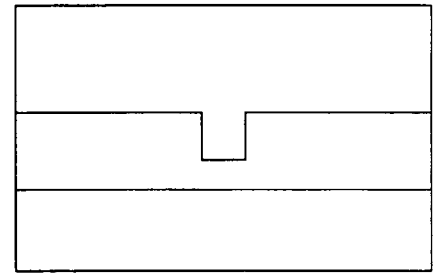
Figure 9:
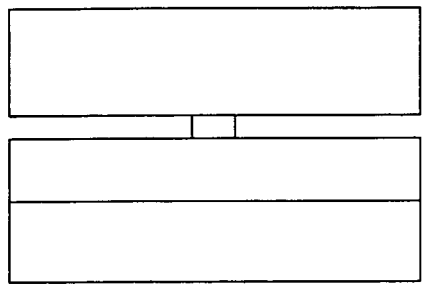
Figure 9:
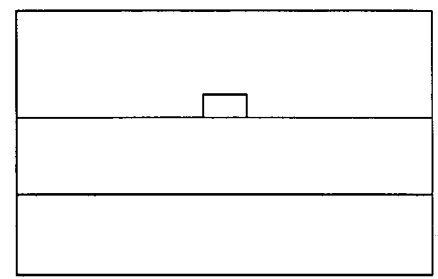
Figure 9:
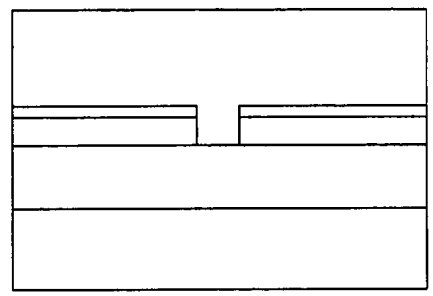

The present invention further provides a number of distinct advantages over other lithographic techniques that have been used to enhance the resolution of conventional contact photolithography. These other techniques may involve the use of metal-embedded masks (MEM) (see FIG. 9(d)), light-coupling masks (LCM) (see FIG. 9(e)), or traditional metal-protrusion mask (MPM) (see FIG. 9(c)). These schemes typically employ either optical near-field effect or light coupling technique for resolution enhancement. However, in MPM, MEM and LCM, the resolution is limited by the thickness of the resist layer due to either light diffraction or near field attenuation. With reference to the present invention (see FIG. 9(a)), because protrusion 14 of hybrid mold 12' penetrates into the resist layer to create the desired resist patterns, the metal layer merely needs to block the very thin resist underneath from being exposed by the ultraviolet radiation. Therefore, the resolution of the present invention is greatly enhanced compared with the prior.

It has been demonstrated that the present invention overcomes the limitations of conventional nanoimprint lithography and contact photolithography by integrating their strengths. With the present invention, no residual layer is left after processing and the patterned structure may have a higher aspect ratio than that on the mold, which simplifies subsequent processing steps and greatly enhances the throughput by eliminating the oxygen RIE step. Compared with contact photolithography techniques, the present invention achieves much higher resolution by reducing the effective resist thickness down to tens of nanometers.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of fabricating a device, said method comprising:
    imprinting a mold having a protrusion against a substrate having a resist layer such that said protrusion engages said resist layer;
    positioning a mask member generally adjacent said resist layer;
    transmitting radiation energy through said mold and into said resist layer, said mask member substantially preventing transmission of said radiation energy therethrough thereby defining an unexposed area in said resist layer;
    removing said mold from said substrate thereby forming a first feature within said resist layer; and
    removing said unexposed area of said resist layer thereby forming a second feature within said resist layer.

2. The method according to claim 1 wherein said transmitting radiation energy comprises:
    transmitting ultraviolet radiation energy.

3. The method according to claim 1 wherein said positioning said mask member generally adjacent said resist layer comprises:
    coupling said mask member to said mold whereby said mask member is positioned generally adjacent said resist layer during said imprinting said mold having a protrusion against a substrate.

4. The method according to claim 1 wherein said imprinting said mold having said protrusion against said substrate further comprises:
imprinting said mold having said protrusion against said substrate at a temperature greater than about a glass transition temperature of said resist layer.

5. The method according to claim 1 wherein said imprinting said mold having said protrusion against said substrate further comprises:
imprinting said mold having said protrusion against said substrate at about a room temperature.

6. The method according to claim 1, further comprising:
removing a portion of said resist layer disposed between a bottom of said first feature and said substrate.

7. A method of fabricating a device, said method comprising:
imprinting a mold having a protrusion against a substrate having a resist layer such that said protrusion engages said resist layer, said protrusion having a mask member disposed therein;
transmitting radiation energy through said mold and into said resist layer, said mask member substantially preventing transmission of said radiation energy therethrough thereby defining an unexposed area in said resist layer;
removing said mold from said substrate thereby forming a first feature within said resist layer; and
removing said unexposed area of said resist layer.

8. The method according to claim 7 wherein said transmitting radiation energy comprises:
transmitting ultraviolet radiation energy.

9. The method according to claim 7 wherein said imprinting said mold having said protrusion against said substrate further comprises:
imprinting said mold having said protrusion against said substrate at a temperature greater than about a glass transition temperature of said resist layer.

10. The method according to claim 7 wherein said imprinting said mold having said protrusion against said substrate further comprises:
imprinting said mold having said protrusion against said substrate at about a room temperature.

11. A method of fabricating a device, said method comprising:
providing a mold having a protrusion extending therefrom and a mask area, said mask area preventing transmission of radiation energy therethrough;
providing a substrate having a resist layer;
imprinting said mold against said substrate such that said protrusion engages said resist layer and said mask area is generally adjacent said resist layer;
transmitting radiation energy through said mold and into said resist layer, said mask area preventing transmission of said radiation energy therethrough to define an unexposed area in said resist layer;
removing said mold from said substrate thereby forming a first feature within said resist layer; and
developing said resist layer to remove said unexposed area thereby forming a second feature within said resist layer.

12. A method of fabricating a device, said method comprising:
providing a mold having a first portion permitting transmission of radiation energy and a second portion preventing transmission of radiation energy;
providing a substrate having a resist layer;
pressing said substrate and said mold together thereby imprinting a shape of said mold into said resist layer;
passing radiation energy through said first portion of said mold and into a portion of said resist layer to define an exposed region, a portion of said resist layer outside said exposed region being an unexposed region; and
removing one of said exposed region and said unexposed region of said resist layer.

13. The method according to claim 12 wherein said pressing said substrate and said mold together thereby imprinting said shape of said mold into said resist layer further comprises:
pressing said substrate and said mold together at a temperature greater than about a glass transition temperature of said resist layer, thereby imprinting said shape of said mold into said resist layer.

* * * * *

UNITED STATES PATENT AND TRADEMARK OFFICE
CERTIFICATE OF CORRECTION

PATENT NO. : 7,374,864 B2 Page 1 of 1
APPLICATION NO. : 10/545456
DATED : May 20, 2008
INVENTOR(S) : Lingjie J. Guo et al.

It is certified that error appears in the above-identified patent and that said Letters Patent is hereby corrected as shown below:

Column 5, line 52, "kg/cm2" should be --$kg/cm^2$--.

Column 6, line 34, after "wavelengths" insert --that--.

Column 7, line 17, "while" should be --which--.

On the Title Page, second column under OTHER PUBLICATIONS, Problems of the nanoimprinting technique for nanometer scale pattern definition, H.C.-C. Scheer, et al., "pettern" should be --pattern--.

Signed and Sealed this

Twenty-eighth Day of October, 2008

JON W. DUDAS
*Director of the United States Patent and Trademark Office*